(12) United States Patent  
Cheng et al.

(10) Patent No.: US 8,941,211 B2  
(45) Date of Patent: Jan. 27, 2015

(54) INTEGRATED CIRCUIT USING DEEP TRENCH THROUGH SILICON (DTS)

(71) Applicant: Taiwan Semiconductor Manufacturing Company, Ltd., Hsin-Chu (TW)

(72) Inventors: Kuo-Yu Cheng, Tainan (TW); Wei-Kung Tsai, Tainan (TW); Kuan-Chi Tsai, Kaohsiung (TW); Tsung-Yu Yang, Zhubei (TW); Chung-Long Chang, Dou-Liu (TW); Chun-Hong Chen, Xinpu Township (TW); Chih-Ping Chao, Hsin-Chu (TW); Chen-Yao Tang, Hsin-Chu (TW); Yu Hung Chen, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/782,355

(22) Filed: Mar. 1, 2013

(65) Prior Publication Data

US 2014/0246751 A1 Sep. 4, 2014

(51) Int. Cl.
*H01L 21/70* (2006.01)
*H01L 29/06* (2006.01)
*H01L 21/762* (2006.01)

(52) U.S. Cl.
CPC ...... *H01L 29/0649* (2013.01); *H01L 21/76283* (2013.01)

USPC .......... 257/510; 257/506; 257/E21.564; 257/E21.369; 257/508; 438/296; 438/387; 438/706

(58) Field of Classification Search
USPC ............ 438/387, 706, 296; 257/506, 508, 257/E21.396, E21.564
See application file for complete search history.

(56) References Cited

U.S. PATENT DOCUMENTS

| | | | |
|---|---|---|---|
| 6,395,637 B1 * | 5/2002 | Park et al. | 438/706 |
| 2002/0081809 A1 * | 6/2002 | Pinto et al. | 438/296 |
| 2005/0003625 A1 * | 1/2005 | Wang et al. | 438/387 |
| 2010/0032796 A1 * | 2/2010 | Brown et al. | 257/510 |
| 2010/0283119 A1 * | 11/2010 | Haeusler | 257/508 |

* cited by examiner

*Primary Examiner* — Matthew Reames
*Assistant Examiner* — Vincent Wall
(74) *Attorney, Agent, or Firm* — Slater & Matsil, L.L.P.

(57) ABSTRACT

An embodiment radio frequency area of an integrated circuit is disclosed. The radio frequency area includes a substrate having an implant region. The substrate has a first resistance. A buried oxide layer is disposed over the substrate and an interface layer is disposed between the substrate and the buried oxide layer. The interface layer has a second resistance lower than the first resistance. A silicon layer is disposed over the buried oxide layer and an interlevel dielectric is disposed in a deep trench. The deep trench extends through the silicon layer, the buried oxide layer, and the interface layer over the implant region. The deep trench may also extend through a polysilicon layer disposed over the silicon layer.

20 Claims, 14 Drawing Sheets

INTEGRATED CIRCUIT USING DEEP TRENCH THROUGH SILICON (DTS)

BACKGROUND

Silicon on insulator (SOI) technology refers to the use of a layered silicon-insulator-silicon substrate in place of conventional silicon substrates in semiconductor manufacturing. SOI-based devices differ from conventional silicon-built devices in that the silicon junction is above an electrical insulator, typically silicon dioxide.

The implementation of SOI technology is one of several manufacturing strategies employed to allow the continued miniaturization of microelectronic devices, which may be referred to as extending Moore's Law. Reported benefits of SOI technology relative to conventional silicon (bulk complementary metal-oxide-semiconductor CMOS)) processing may include, for example, lower parasitic capacitance due to isolation from the bulk silicon, which improves power consumption at matched performance, and resistance to latch-up due to isolation of the n- and p-well structures.

From a manufacturing perspective, SOI substrates are compatible with most conventional fabrication processes. Indeed, an SOI-based process may be implemented without special equipment or significant retooling of an existing factory. The SOI process may be used to form an integrated circuit having a metal-oxide-semiconductor field-effect transistor (MOSFET) area and a radio frequency (RF) area.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to embodiments in a specific context, namely an integrated circuit having a metal-oxide-semiconductor field-effect transistor (MOSFET) area and a radio frequency (RF) area and suitable for use within an inductor or transmission line. The disclosure may also be applied, however, to other integrated circuits, electronic structures, and the like.

Figure 1:
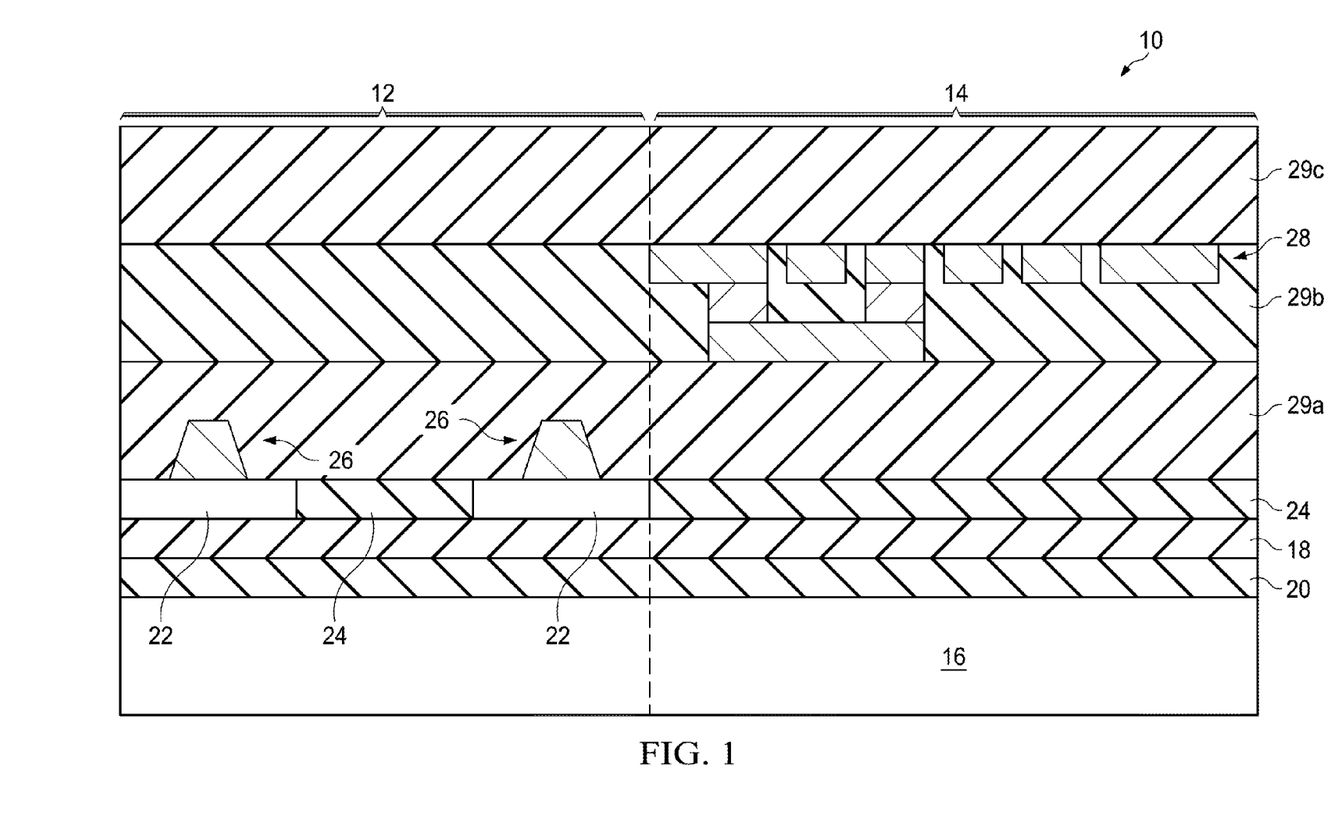
FIG. 1 illustrates an integrated circuit including a metal-oxide-semiconductor field-effect transistor (MOSFET) area and a radio frequency (RF) area.

Referring now to FIG. 1, an integrated circuit 10 formed using a normal fabrication process is illustrated for reference purposes. As shown, the reference integrated circuit 10 generally includes a metal-oxide-semiconductor field-effect transistor (MOSFET) area 12 and a radio frequency (RF) area 14. It should be recognized by those skilled in the art that the symbol "≈" in FIGS. 1, 2, 3A, and 5 represents various layers or structures that are not needed for a full and complete understanding of the disclosure and, as such, have been omitted for ease of illustration.

The MOSFET area 12 and the RF area 14 of the reference integrated circuit 10 each include a high-resistance (high-R) substrate 16 supporting a buried oxide (BOX) layer 18. Portions of the high-resistance substrate 16 and the buried oxide layer 18 at or near an interface between the high-resistance substrate 16 and the buried oxide layer 18 interact with each other. The interacting portions of the high-resistance substrate 16 and the buried oxide layer 18 behave much like a low-resistance (low-R) or lossy layer. Therefore, a low-resistance layer 20 has been depicted at the interface between the high-resistance substrate 16 and the buried oxide layer 18 in FIG. 1. For ease of illustration, the thickness of the low-resistance layer 20 has been exaggerated.

Still referring to FIG. 1, the MOSFET area 12 of the reference integrated circuit 10 includes portions of a silicon (Si) layer 22 separated by a shallow trench isolation (STI) region 24. The portions of the silicon layer 22 and the shallow trench isolation region 24 are each disposed over the buried oxide layer 18 in the MOSFET area 12. As shown, the opposing portions of the silicon layer 22 in the MOSFET area 12 support a contact structure 26 formed using polysilicon (PO).

The RF area 14 of the reference integrated circuit 10 also includes a shallow trench isolation region 24. As shown, the shallow trench isolation region 24 is generally disposed over the buried oxide layer 18 throughout the RF area 14. In addition, the RF area 14 also includes interconnects 28 formed in one or more dielectric layers (illustrated by layers 29a-29c, each of which represents one or more individual dielectric layers) used to suitably couple the RF area 14 of the reference integrated circuit 10 with another device (e.g., an inductor, a transmission line, etc.). In other words, the interconnects 28 may be inductor interconnects or transmission line interconnects.

Still referring to FIG. 1, the low-resistance layer 20, which is generally inhomogeneous, may degrade the radio frequency performance of the reference integrated circuit 10. By way of example, the low-resistance layer 20 may permit eddy-current losses to adversely impact the quality factor (Q-factor) of an inductor. In addition, the low-resistance layer 20 may cause unacceptable insertion losses for a transmission line. This is due, at least in part, to unexpected charges forming at or around the interface between the high-resistance substrate 16 and the buried oxide layer 18.

Figure 2:
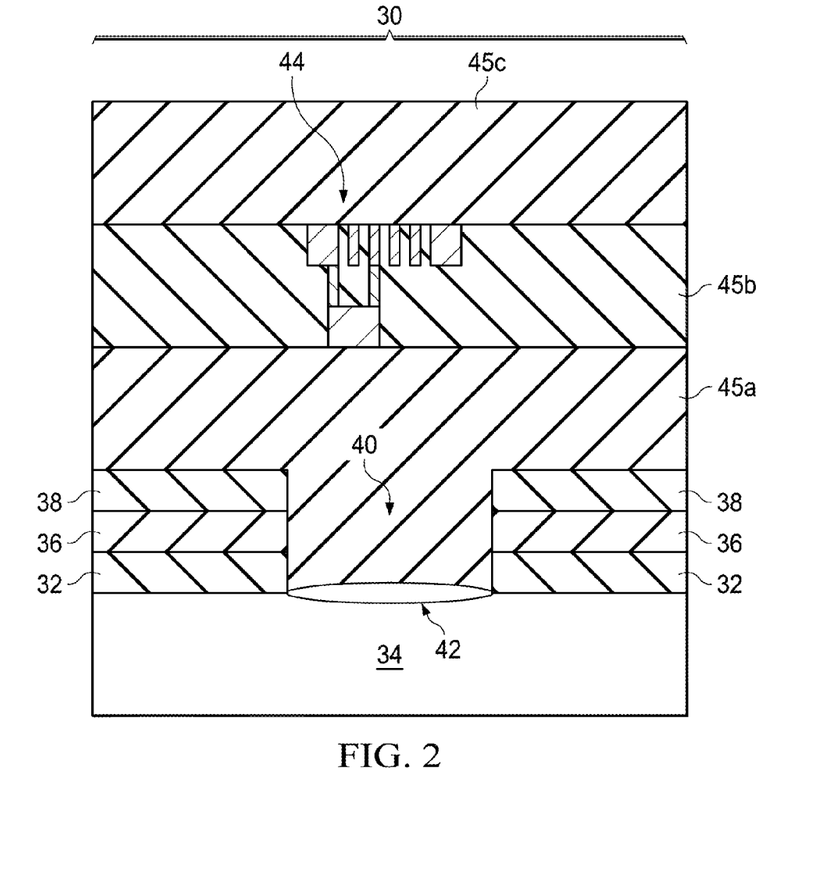
FIG. 2 illustrates a radio frequency area having a deep trench (DT) disposed over an implant region and passing through a shallow trench isolation (STI) region, the deep trench separating portions of a low-resistance (low-R) layer.

Referring now to FIG. 2, an RF area 30 from another reference integrated circuit is illustrated Like the RF area 14 of FIG. 1, the RF area 30 of FIG. 2 includes a low resistance layer 32 formed due to the interaction of the high-resistance substrate 34 and the buried oxide layer 36 at an interface between the two. The RF area 30 also includes the shallow trench isolation region 38. However, unlike the radio frequency area 12 of FIG. 1, the radio frequency area 30 of FIG. 2 includes a deep trench (DT) 40 filled with an interlevel dielectric and disposed over an implant region 42. As shown, the deep trench 40 is formed through the shallow trench isolation region 38.

As shown in FIG. 2, the radio frequency area 30 also includes interconnects 44 formed in one or more dielectric layers (illustrated by layers 45a-45c, each of which represents one or more individual dielectric layers) used to suitably couple the RF area 30 of the reference integrated circuit with another device (e.g., an inductor, a transmission line, etc.). In other words, the interconnects 44 may be inductor interconnects or transmission line interconnects.

Figure 3A:
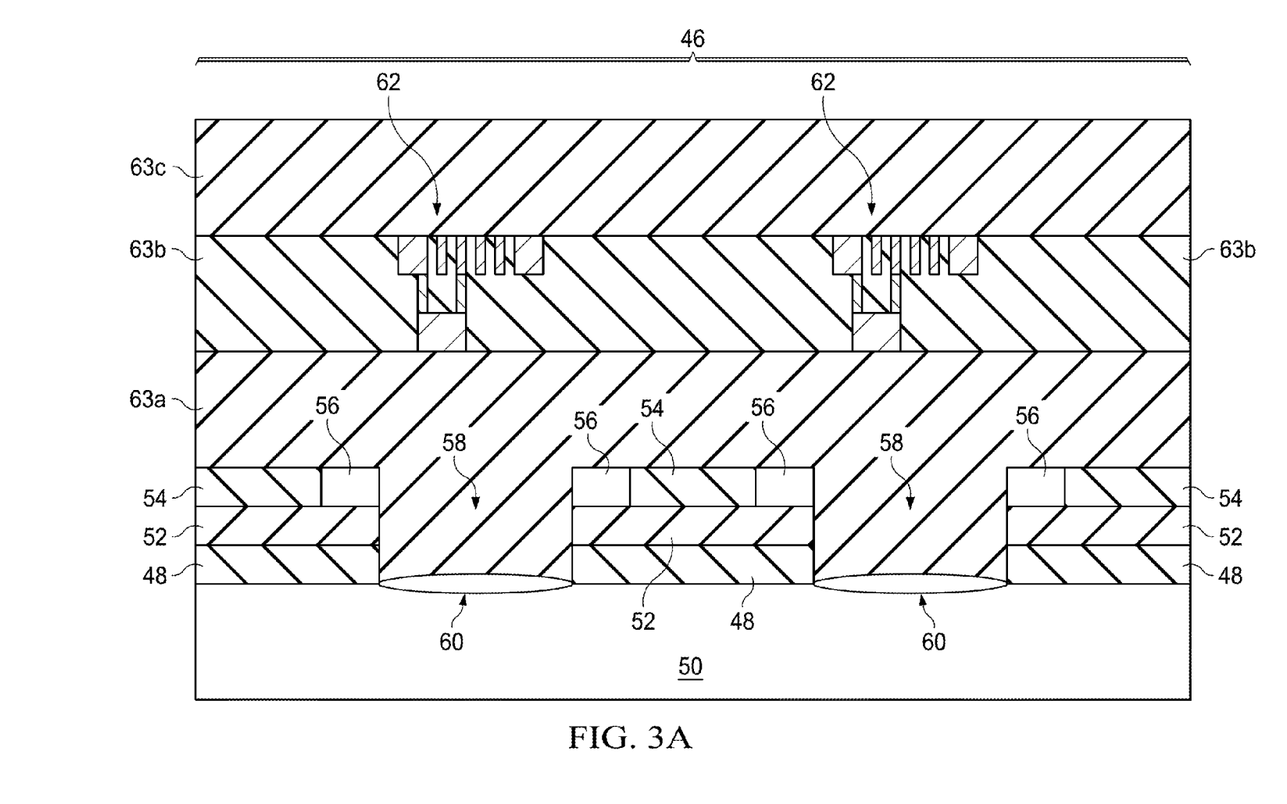
FIG. 3A illustrates an embodiment radio frequency area having a deep trench disposed over an implant region through a silicon (Si) layer, the deep trench separating portions of a low-resistance layer.
Figure 3B:
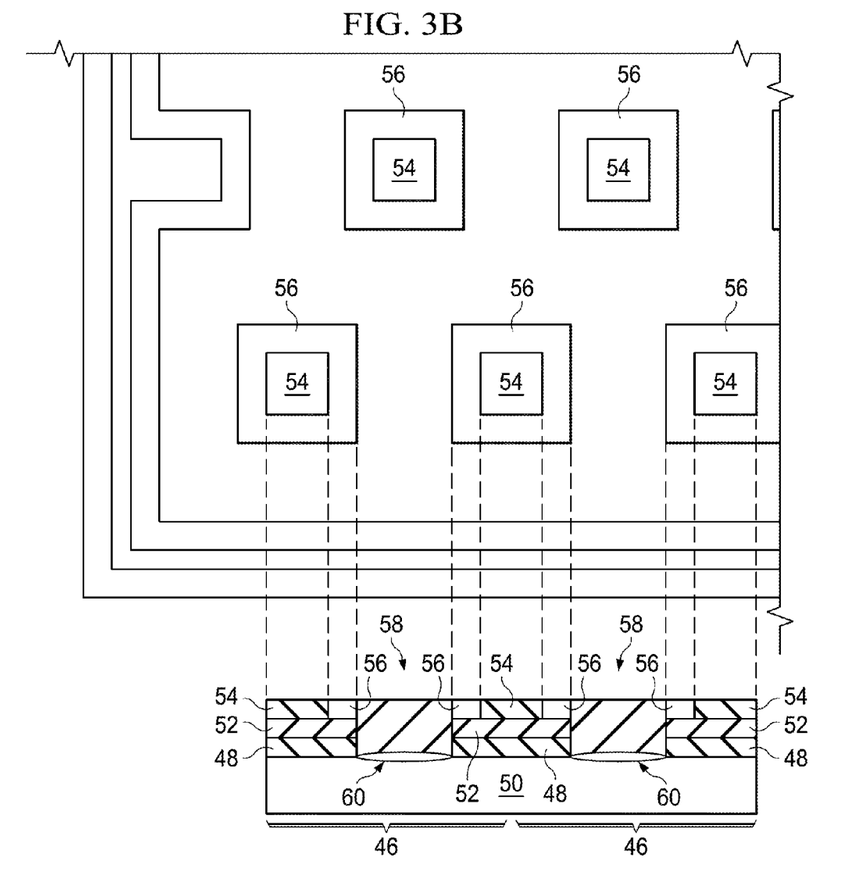
FIG. 3B collectively illustrates top and cross section views of the embodiment radio frequency area of FIG. 3A within an integrated circuit.

Referring collectively to FIGS. 3A-3B, use of the deep trench 58 within an integrated circuit is shown. As shown in FIG. 3B, the deep trench 58 encircles portions of silicon layer 56, which in turn surround portions of isolation region 54 Referring now to FIG. 3A, an embodiment RF area 46 of an integrated circuit is illustrated. The embodiment RF area 46 includes a low-resistance layer 48 generated at the interface between the high-resistance substrate 50 and the buried oxide layer 52. In an embodiment, the high-resistance layer 50 comprises silicon or a silicon-containing material with a high defect concentration. In an embodiment, the high-resistance layer 50 has a resistance of greater than about 750 ohms-centimeter.

In an embodiment, the low-resistance layer 48 (a.k.a., the interface layer) has a resistance that is considerably less than about 750 ohms-centimeter. Indeed, the low-resistance layer 48 may have a resistance that is much less than the resistance of the high-resistance substrate 50 and/or the resistance of the buried oxide layer 52. As such, the resistance of the high-resistance layer 50 is considerably higher than the resistance of the low-resistance layer 48.

The embodiment RF area 46 also includes portions of a shallow trench isolation region 54 on either side of, or separated by, portions of a silicon (Si) layer 56. As oriented and depicted in FIG. 3A, the shallow trench isolations regions 54 are disposed outside or beyond the portions of the silicon layer 56. In addition, the portions of the shallow trench isolation region 54 and the portions of the silicon layer 54 are all disposed over the buried oxide layer 52 within the RF area 46.

Still referring to FIG. 3A, the embodiment radio frequency area 46 also includes a deep trench (DT) 58, which is filled with an interlevel dielectric and disposed over an implant region 60. As shown, the deep trench 58 passes through the silicon layer 56 as opposed to passing through the shallow trench isolation region 38 as shown in FIG. 2. Therefore, the deep trench 58 of FIG. 3A may be referred to as a deep trench through silicon (DTS). Even though the deep trench 58 passes through the silicon layer 56, the performance of integrated circuit incorporating the radio frequency area 46 of FIG. 3A is comparable to the performance of the radio frequency area 30 in FIG. 2 as will be more fully explained below.

In an embodiment, the deep trench 58 has a depth of between about one nanometer (1 nm) and about thirty nanometers (30 nm). Also, as shown in FIG. 3A, the deep trench 58 generally passes through the silicon layer 56, the buried oxide layer 52, and the low resistance layer 48 at the interface between the buried oxide layer 52 and the high-resistance substrate 50. In an embodiment, the deep trench 58 extends down into the high-resistance substrate 50.

In an embodiment, the implant region 60 in FIG. 3A is formed by implanting ions into the high-resistance substrate 50 through the deep trench 58 prior to the interlevel dielectric material being deposited. For example, argon (Ar), xenon (Xe), and other suitable ions may be implanted through the deep trench 58 prior to the interlevel dielectric being deposited or formed therein.

As shown in FIG. 3A, the RF area 46 also includes interconnects 62 formed in one or more dielectric layers (illustrated by layers 63a-63c, each of which represents one or more individual dielectric layers) used to suitably couple the embodiment RF area 46 of the corresponding integrated circuit with another device (e.g., an inductor, a transmission line, etc.). In other words, the interconnects 62 may be inductor interconnects or transmission line interconnects.

Referring now to FIG. 3B, top and cross section views of the embodiment radio frequency area of FIG. 3A within an integrated circuit are collectively illustrated. As depicted in the top view, in an embodiment the shallow trench isolation region 54 is surrounded or encircled by the silicon layer 56. In addition, in an embodiment the silicon layer 56 is surrounded or encircled by the interlevel dielectric of the deep trench 58. In other words, the shallow trench isolation regions 54 and the silicon layers 56 collectively form islands disposed within a sea of the interlevel dielectric in the deep trench 58.

In an embodiment, the shallow trench isolation regions 54 and the silicon layers 56 are arranged in a pattern within the interlevel dielectric of the deep trench 58. As shown in FIG. 3B, the shallow trench isolation regions 54 may be aligned in one direction (from left to right in FIG. 3B) and offset in another direction (from top to bottom in FIG. 3B). It should be recognized that other arrangements, orientations, and patterns may be used. In addition, while the shallow trench isolation region 54 and the silicon layer 56 have a generally square periphery in FIG. 3B, it should be recognized that these formations may have other shapes (e.g., rectangle, circle, triangle, etc.) in other embodiments.

Referring collectively to FIGS. 4A-4E, a process flow for forming the embodiment RF area 46 of FIG. 3A is illustrated. Beginning with FIG. 4A, the RF area 46 of FIG. 3A is depicted in an initial stage after salicide formation. For ease of illustration, the electrical contacts have been intentionally omitted. As shown, the RF area 46 initially includes the high-resistance substrate 50, the low-resistance layer 48, the buried oxide layer 52, and the silicon layer 56. In an embodiment, a thin layer of silicon dioxide ($SiO_2$) 64 may form or be grown over the silicon layer 56 through thermal oxidation.

Figure 4A:
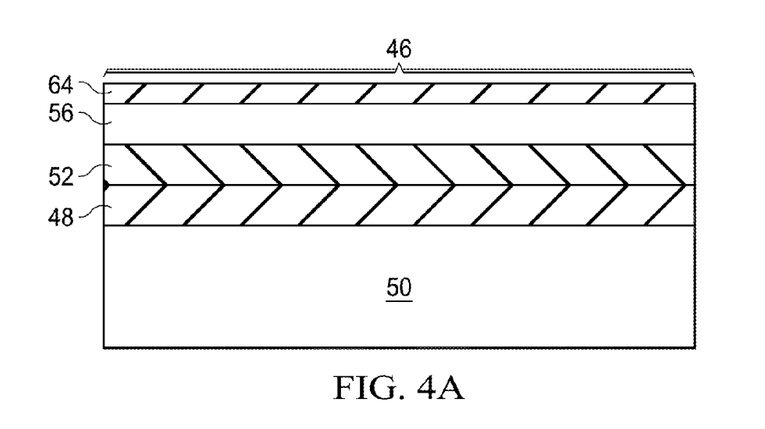
FIGS. 4A-4E illustrate an embodiment process flow used to form the radio frequency area of FIG. 3A.
Figure 4B:
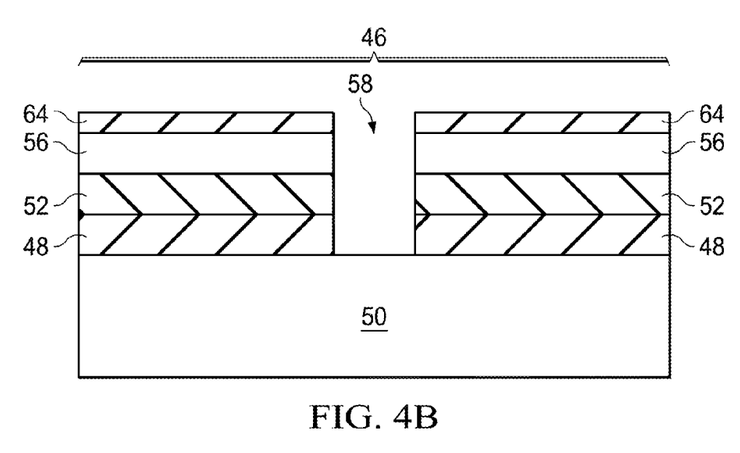

As shown in FIG. 4B, a pattern is defined and an etching process takes place in order to form the deep trench 58. As shown, etching occurs through the silicon layer 56 (perhaps including the thin silicon dioxide layer 64), the buried oxide layer 52, and the low-resistance layer 48 (a.k.a., interface layer) disposed between the buried oxide layer 52 and the high-resistance substrate 50.

Figure 4C:
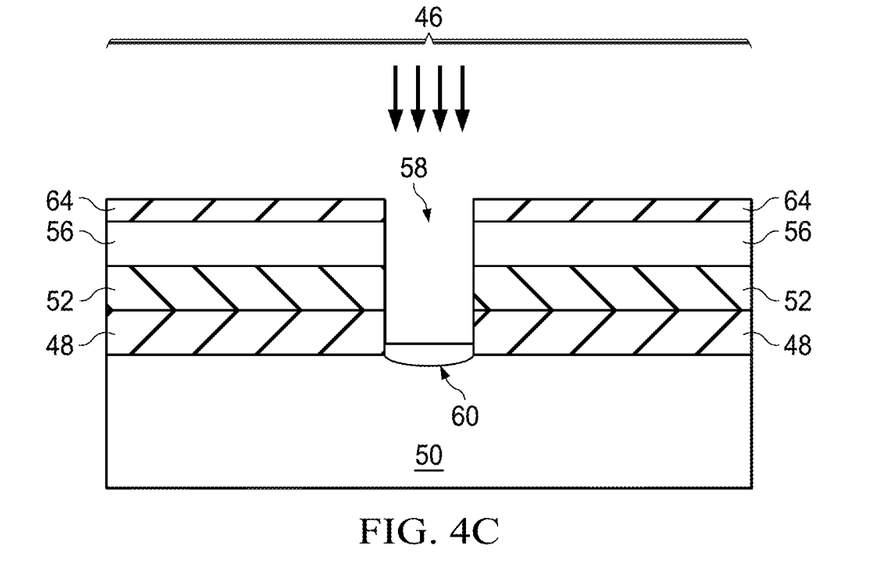

As shown in FIG. 4C, ions are implanted (as represented by the arrows) into a portion of the high-resistance substrate 50 exposed by the deep trench 58. As such, the implant region 60 is formed in the high-resistance substrate 48 beneath the deep trench 58. In an embodiment, argon (Ar), xenon (Xe), and other suitable ions may be implanted through the deep trench 58 to form the implant region 60.

Figure 4D:
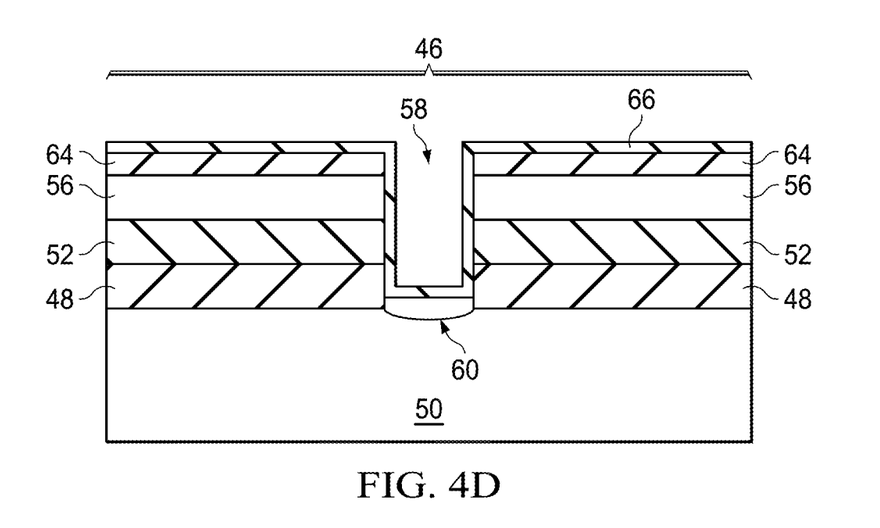

As shown in FIG. 4D, after implantation an etching stop layer 66 is formed over the silicon layer 56 and/or the silicon dioxide layer 64 and on the sidewalls and bottom surface of the deep trench 58. As will be more fully explained below, the etching stop layer 66 may be utilized in a contact etching process. In an embodiment, the etching stop layer 66 is silicon nitride (SiN) or other material suitable for contact etching.

Figure 4E:
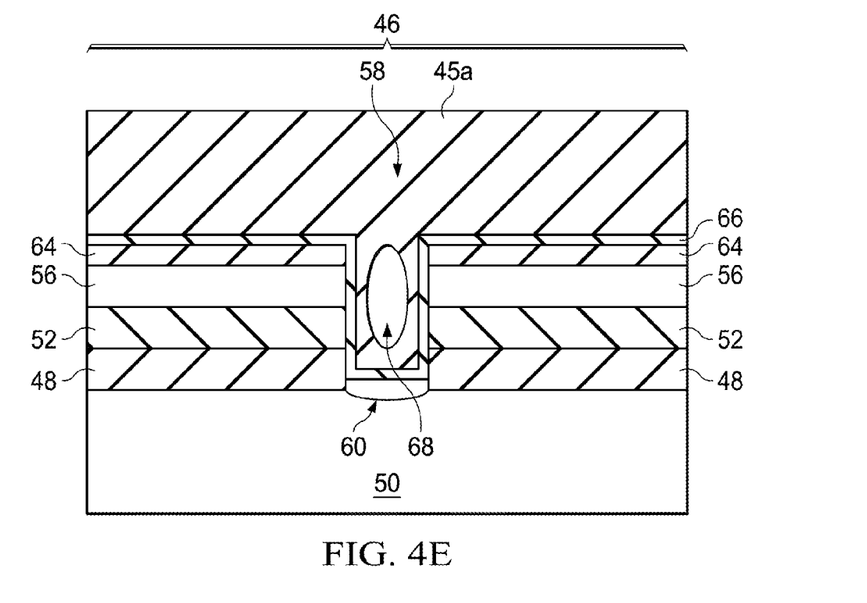

As shown in FIG. 4E, the interlevel dielectric is deposited in the deep trench 58 and over the adjacent portions of the silicon layer 56. In an embodiment, a void 68 forms in the interlevel dielectric disposed within the deep trench 58.

Figure 5:
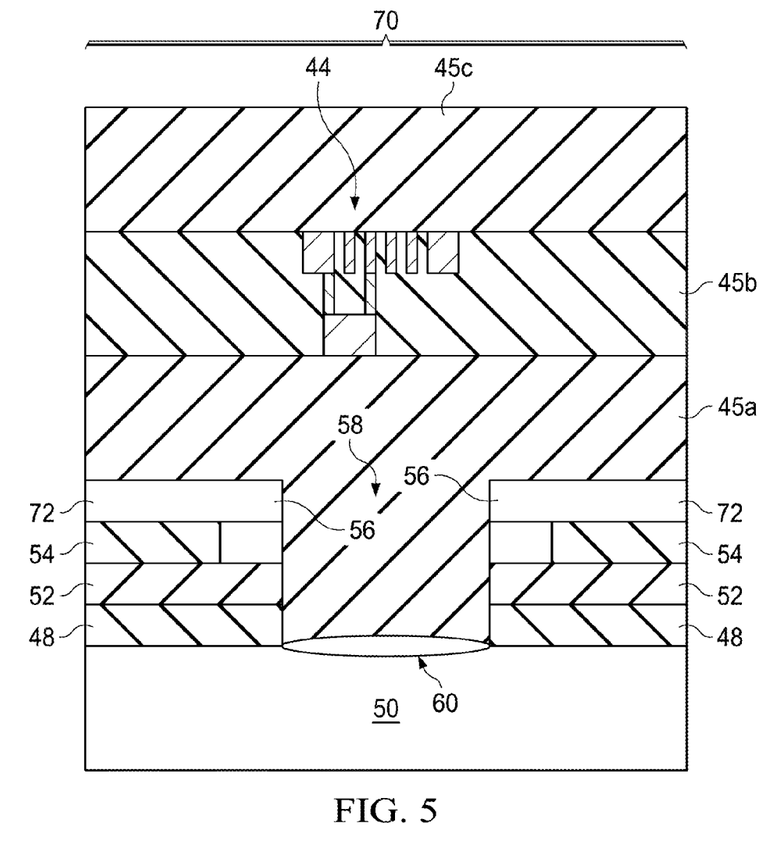
FIGS. 5 illustrates an embodiment radio frequency area having a deep trench formed over an implant region through silicon (Si), the deep trench separating portions of a low-resistance layer.

Referring now to FIG. 5, an embodiment RF area 70 including a polysilicon layer 72 is illustrated. As shown, the polysilicon layer 72 is disposed over the shallow trench isolation regions 54 and the silicon layer 56. In addition, the deep trench 58 generally passes through the polysilicon layer 72, the silicon layer 56, the buried oxide layer 52, the low resistance layer 48 at the interface between the buried oxide layer 52 and the high-resistance substrate 50.

Referring collectively to FIGS. 6A-6F, a process flow for forming the embodiment RF area 70 of FIG. 5 with the polysilicon layer 72 is illustrated. Beginning with FIG. 6A, a portion of the RF area 70 of FIG. 5 is depicted in an initial stage after salicide formation. For ease of illustration, electrical contacts have been intentionally omitted. As shown, the embodiment RF area 70 includes the high-resistance substrate 50, the low-resistance layer 48, the buried oxide layer 52, the silicon layer 56, and the polysilicon layer 72. In an embodiment, a thin layer of silicon dioxide ($SiO_2$) 64 may form or be grown over the silicon layer 56 through thermal oxidation.

Figure 6A:
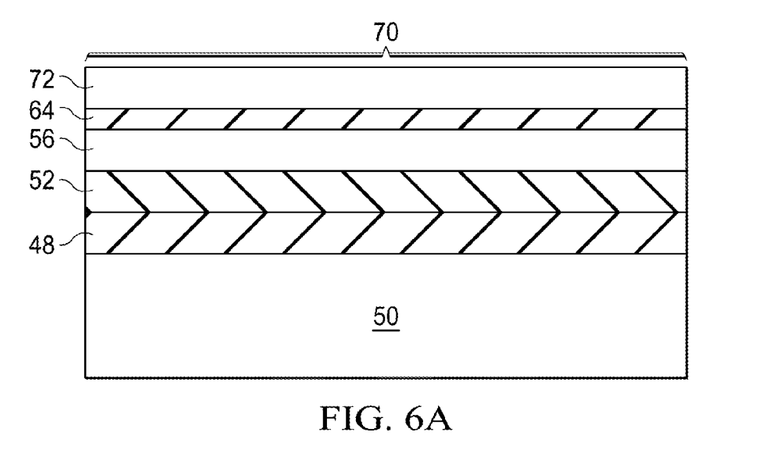
FIGS. 6A-6F illustrate an embodiment process flow used to form the radio frequency area of FIG. 5.
Figure 6B:
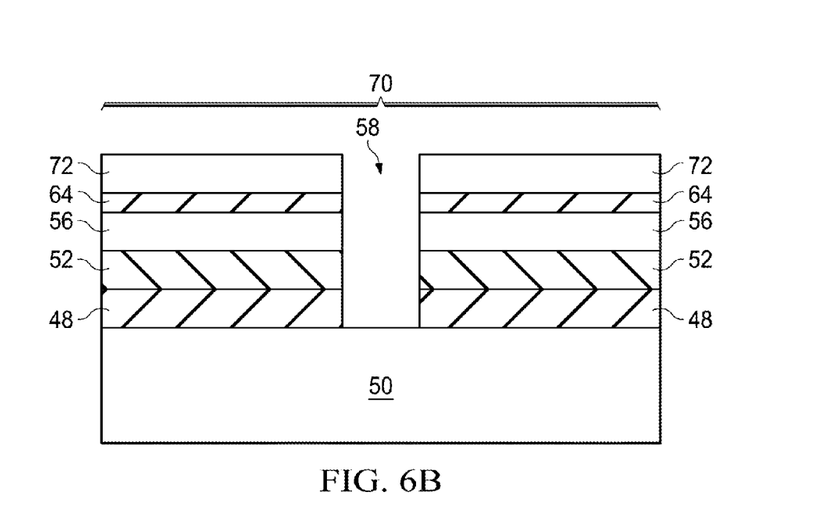

As shown in FIG. 6B, a pattern is defined and an etching process takes place in order to form the deep trench 58. As shown, etching occurs through the polysilicon layer 72, the silicon layer 56 (perhaps including the thin silicon dioxide layer 64), the buried oxide layer 52, and the low-resistance layer 48 (a.k.a., interface layer) disposed between the buried oxide layer 52 and the high-resistance substrate 50.

Figure 6C:
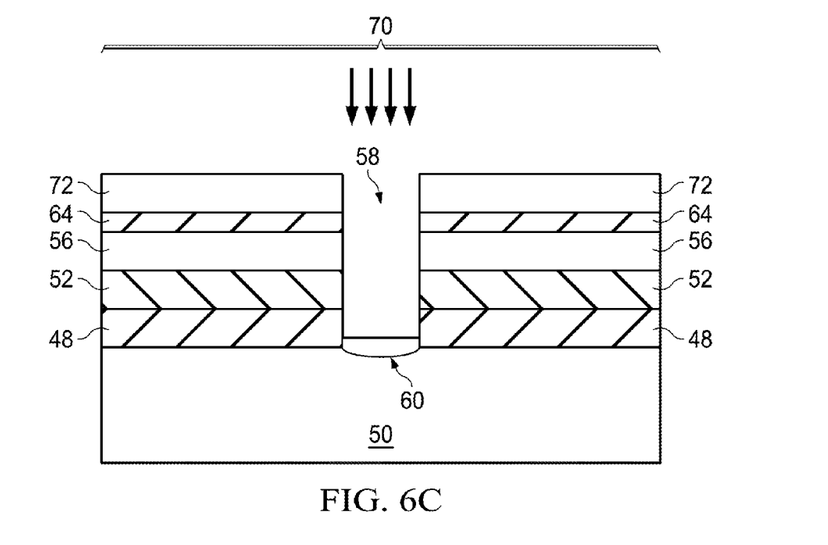

As shown in FIG. 6C, ions are implanted (as represented by the arrows) into a portion of the high-resistance substrate 50 exposed by the deep trench 58. As such, the implant region 60 is formed in the high-resistance substrate 60 beneath the deep trench 58. In an embodiment, argon (Ar), xenon (Xe), and other suitable ions may be implanted through the deep trench 58 to form the implant region 60.

Figure 6D:
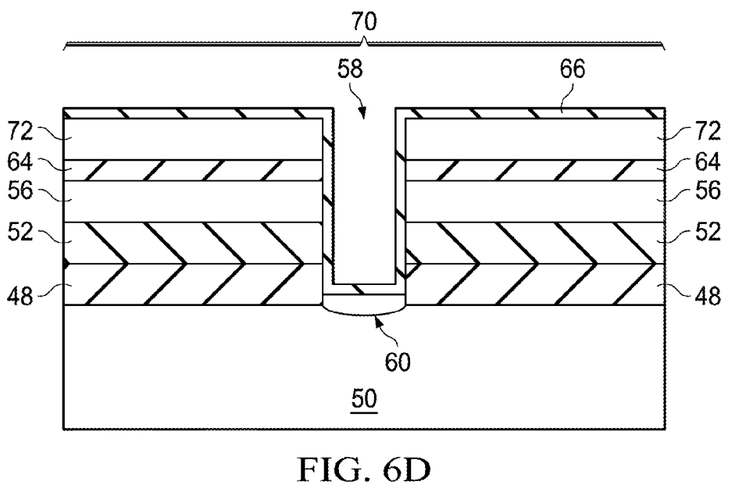

As shown in FIG. 6D, after implantation the etching stop layer 66 is formed over the polysilicon layer 72 and on the sidewalls and bottom surface of the deep trench 58. As will be more fully explained below, the etching stop layer 66 may be utilized in a contact etching process. In an embodiment, the etching stop layer 66 is silicon nitride (SiN) or other material suitable for contact etching.

Figure 6E:
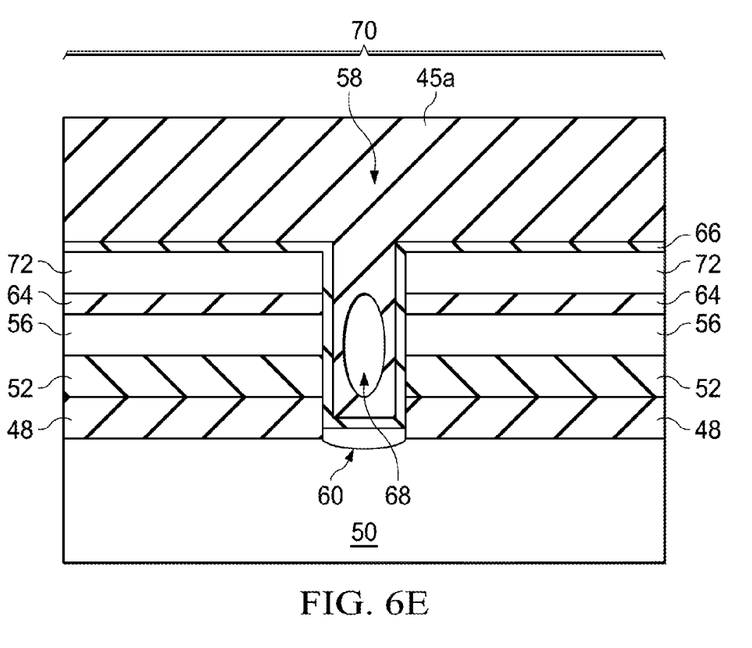
Figure 6F:
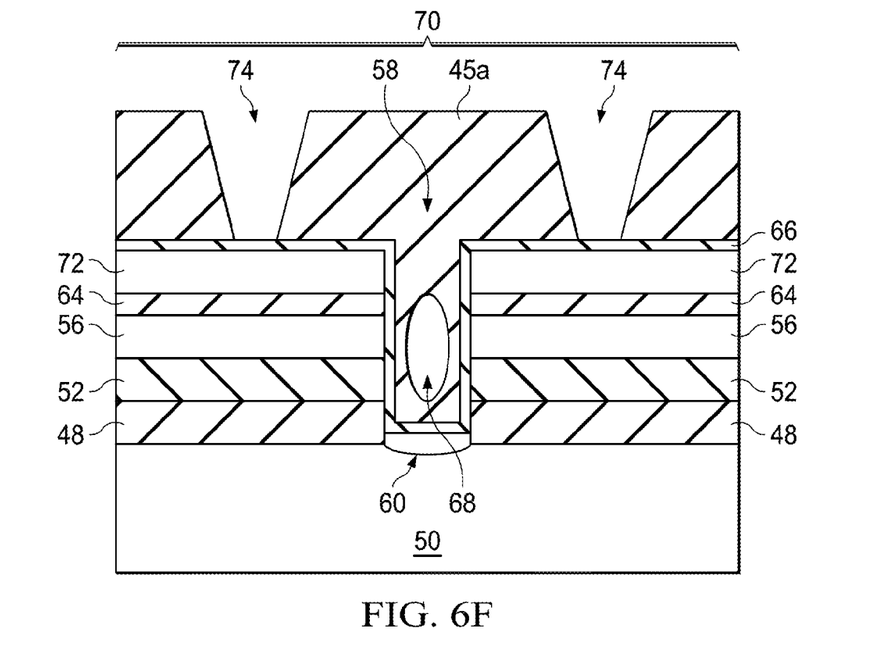

As shown in FIG. 6E, the interlevel dielectric is deposited in the deep trench 58 and over the adjacent portions of the polysilicon layer 72. In an embodiment, a void 68 forms in the interlevel dielectric disposed within the deep trench 58. As shown in FIG. 6F, a contact etching (CT) process may be performed to etch through the interlevel dielectric. The etching process may continue until the etching stop layer 66 is reached. As shown in FIG. 6D, the etching process forms suitably sized openings 74 passing through the dielectric material. It should be recognized that the contact etching process may also be performed on the RF area 46 illustrated in FIG. 4E.

Figure 7:
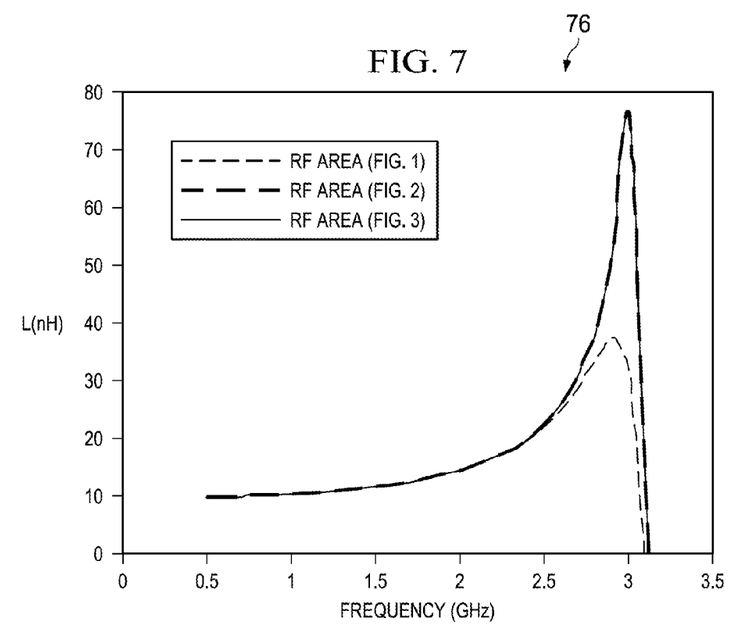
FIG. 7 is a chart comparing the inductance of the radio frequency area of FIG. 1 (without a deep trench), the radio frequency area of FIG. 2 (with a deep trench though STI), and the radio frequency area of FIG. 3A (with a deep trench through silicon)
Figure 8:
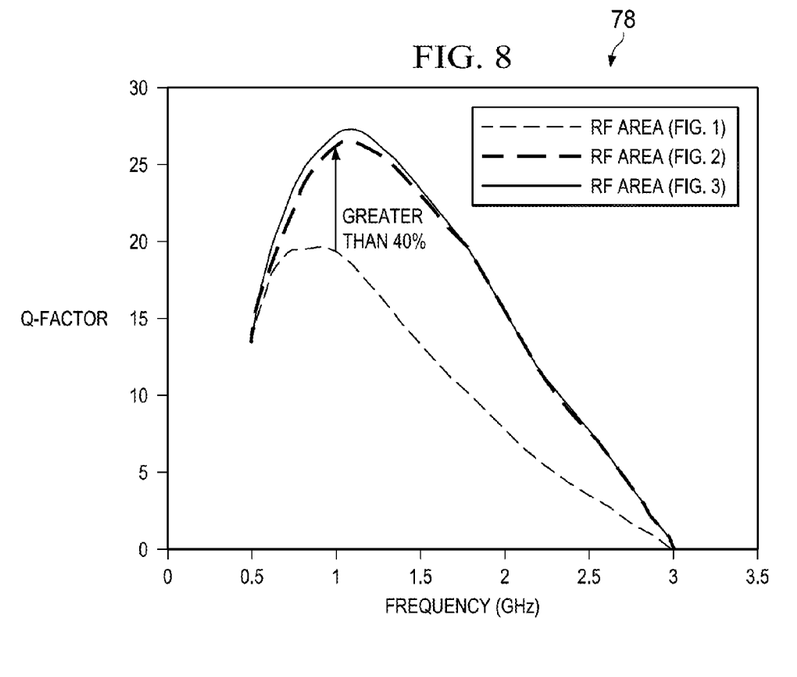
FIG. 8 is a chart comparing the quality factor (Q-factor) of the radio frequency area of FIG. 1 (without a deep trench), the radio frequency area of FIG. 2 (with a deep trench though STI), and the radio frequency area of FIG. 3A (with a deep trench through silicon)

Referring now to FIGS. 7-8, an inductor silicon verification process was conducted using an UTM+RV+AP inductor coil with a STD W50S50R175N3.5 inductor type. The inductor was fabricated using a 018 silicon on insulator (SOI) process.

In FIG. 7, a chart 76 comparing the inductance of the RF area 14 of FIG. 1 (without a deep trench), the RF area 30 of FIG. 2 (with the deep trench 40 though the shallow trench isolation region 38), and the embodiment RF area 46 of FIG. 3A (with the deep trench 58 through the silicon layer 56) is illustrated. As shown, the embodiment RF area 46 having the deep trench 58 passing through the silicon layer 56 (FIG. 3A) had an inductance generally equivalent to the inductance of the RF area 30 having the deep trench 40 passing through the shallow trench isolation regions 38 (FIG. 2).

In FIG. 8, a chart 78 comparing the quality factor of the RF area 14 of FIG. 1 (without a deep trench), the RF area 30 of FIG. 2 (with the deep trench 40 though the shallow trench isolation region 38), and the embodiment RF area 46 of FIG. 3A (with the deep trench 58 through the silicon layer 56) is illustrated. As shown, the embodiment RF area 46 having the deep trench 58 passing through the silicon layer 56 (FIG. 3A) had quality factor that exceeded the quality factor of the RF area 30 having the deep trench 40 passing through the shallow trench isolation regions 38 (FIG. 2).

Figure 9:
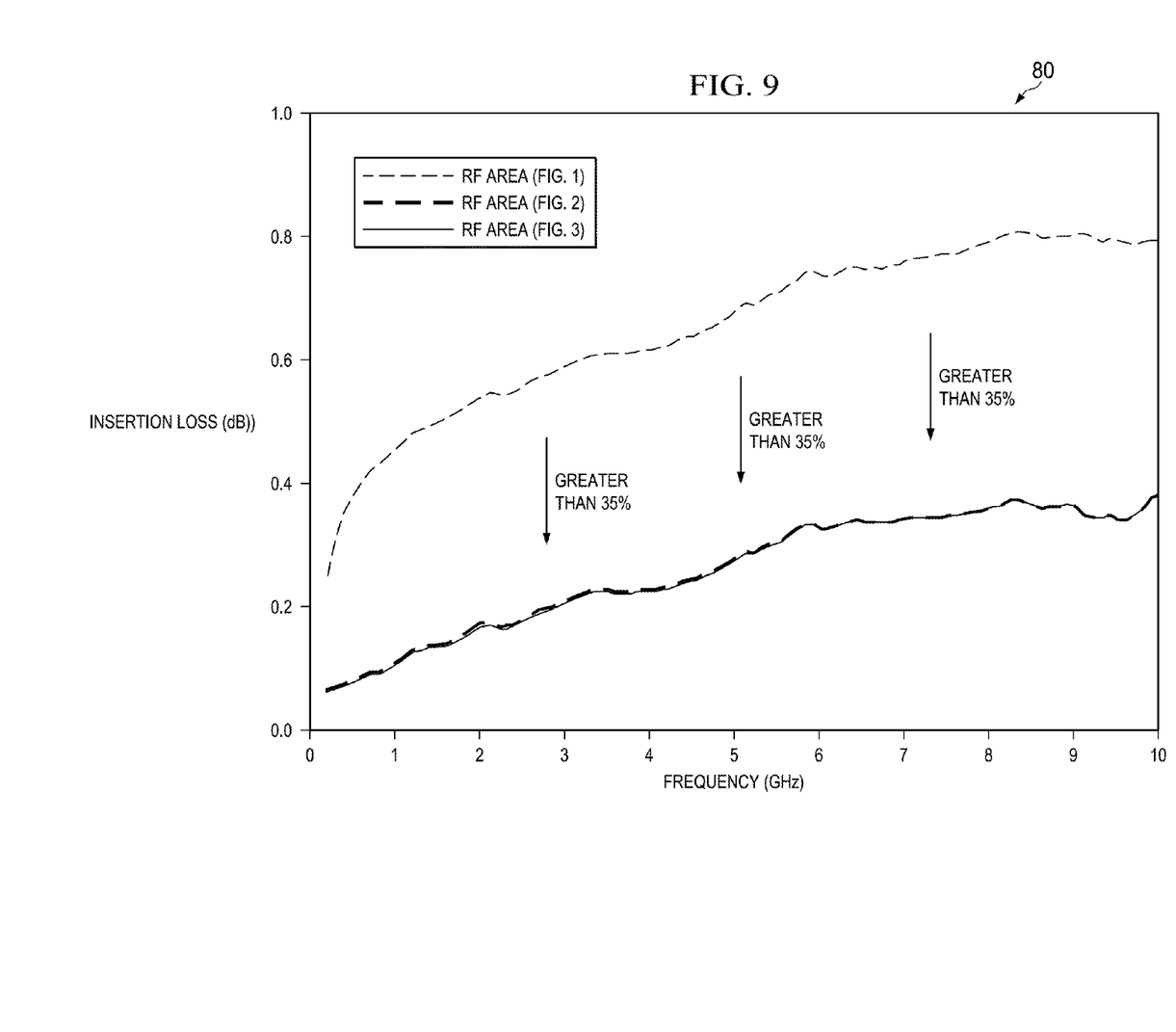
FIG. 9 is a chart comparing the quality factor (Q-factor) of the radio frequency area of FIG. 1 (without a deep trench), the radio frequency area of FIG. 2 (with a deep trench though STI), and the radio frequency area of FIG. 3A (with a deep trench through silicon)

Referring now to FIG. 9, a transmission line silicon verification process was conducted using an M4(DUTM) transmission line signal layer with a W50L3000 transmission line size. The inductor was fabricated using a 0.18 μm silicon on insulator (SOI) process.

A chart 80 comparing the insertion loss of the RF area 14 of FIG. 1 (without a deep trench), the RF area 30 of FIG. 2 (with the deep trench 40 though the shallow trench isolation region 38), and the embodiment RF area 46 of FIG. 3A (with the deep trench 58 through the silicon layer 56) is illustrated. As shown, the embodiment RF area 46 having the deep trench 58 passing through the silicon layer 56 (FIG. 3A) had an insertion loss generally equivalent to the insertion loss of the RF area 30 having the deep trench 40 passing through the shallow trench isolation regions 38 (FIG. 2).

Figure 10:
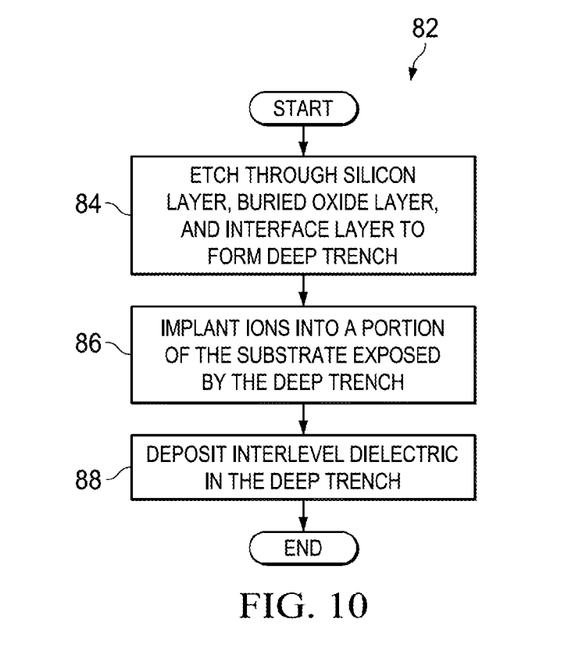
FIG. 10 illustrates an embodiment method of forming a radio frequency (RF) area of an integrated circuit.

Referring now to FIG. 10, an embodiment method 82 of forming a radio frequency (RF) area of an integrated circuit is illustrated. In block 84, an etching process is performed to etch through a silicon layer, a buried oxide layer, and an interface layer disposed between the buried oxide layer and a substrate to form a deep trench. In block 86, ions are implanted into a portion of the substrate exposed by the deep trench. In block 88, an interlevel dielectric is deposited in the deep trench.

Figure 11:
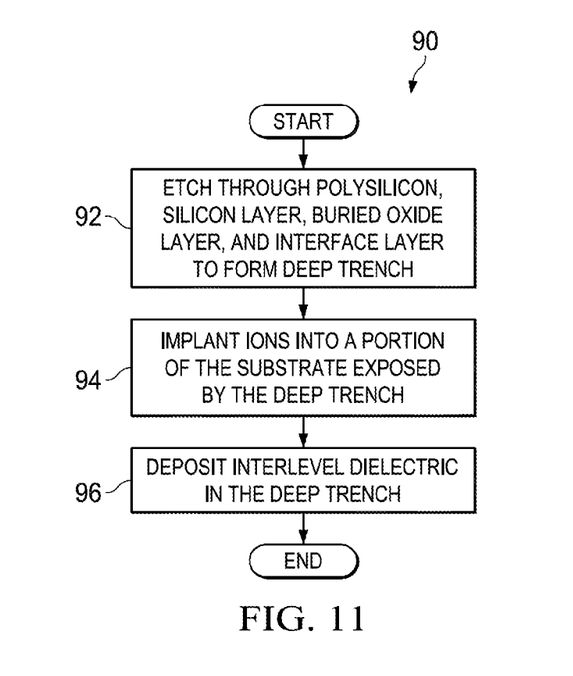
FIG. 11 illustrates an embodiment method of forming a radio frequency (RF) area of an integrated circuit.

Referring now to FIG. 11, an embodiment method 90 of forming a radio frequency (RF) area of an integrated circuit is illustrated. In block 92, an etching process is performed to etch through a polysilicon layer, a silicon layer, a buried oxide layer, and an interface layer disposed between the buried oxide layer and a substrate to form a deep trench. In block 94, ions are implanted into a portion of the substrate exposed by the deep trench. In block 96, an interlevel dielectric is deposited in the deep trench.

From the foregoing, it should be recognized that the process or processes of forming the embodiment radio frequency area 10 disclosed herein offer significant advantages. For example, the deep trench through silicon or polysilicon/silicon and implant process (i.e., the DTS+Implant process) disclosed herein is able to mitigate or eliminate the negative effects of the low-resistance layer and show the original superiority of the silicon-on-insulator high-resistance substrate quality. In addition, the DTS+Implant process may limit undesirable electric and magnetic energy dissipation. Moreover, the DTS+Implant process is applicable to arbitrarily-shaped geometries and doping profiles between substrate features (e.g., deep trench width/space/depth extensions, silicon/oxide and buried layers thickness). Still further, the DTS+Implant process may also be combined in a normal logic process and take full advantage of the silicon-on-insulator (SOI) process.

An embodiment method of forming a radio frequency (RF) area of an integrated circuit including etching through a silicon layer, a buried oxide layer, and an interface layer disposed between the buried oxide layer and a substrate to form a deep trench, implanting ions into a portion of the substrate exposed by the deep trench, and depositing an interlevel dielectric in the deep trench.

An embodiment method of forming a radio frequency (RF) area of an integrated circuit including etching through a polysilicon layer, a silicon layer, a buried oxide layer, and an interface layer disposed between the buried oxide layer and a substrate to form a deep trench, implanting ions into a portion the substrate exposed by the deep trench, and depositing an interlevel dielectric in the deep trench.

An embodiment radio frequency area of an integrated circuit including a substrate having a first resistance, the substrate including an implant region, a buried oxide layer disposed over the substrate, an interface layer between the substrate and the buried oxide layer, the interface layer having a second resistance lower than the first resistance, a silicon layer disposed over the buried oxide layer, and an interlevel dielectric disposed in a deep trench, the deep trench extending through the silicon layer, the buried oxide layer, and the interface layer over the implant region.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A radio frequency area of an integrated circuit, comprising:
    a substrate having a first resistance, the substrate including an implant region;
    a buried oxide layer disposed over the substrate;
    an interface layer between the substrate and the buried oxide layer, the interface layer having a second resistance lower than the first resistance;
    a silicon layer disposed over the buried oxide layer;
    a shallow trench isolation extending from an upper surface of the silicon layer to the buried oxide layer, the shallow trench isolation terminating at the buried oxide layer; and
    an interlevel dielectric disposed in a deep trench and engaging an uppermost sidewall of the silicon layer, the deep trench extending through the silicon layer, the buried oxide layer, and the interface layer over the implant region, the deep trench having substantially vertical sidewalls extending from the top surface of the silicon layer to the bottom of the deep trench.

2. The radio frequency area of claim 1, wherein the deep trench has a depth of between about 1 nanometer and about 30 nanometers and the substrate comprises one of silicon and a silicon-containing material.

3. The radio frequency area of claim 1 wherein the first resistance is greater than about 750 ohms-centimeter and the second resistance is less than about 750 ohms-centimeter.

4. The radio frequency area of claim 1, wherein the interface layer is inhomogeneous.

5. The radio frequency area of claim 1, wherein a polysilicon layer is disposed over the silicon layer and the deep trench extends through the polysilicon layer.

6. The radio frequency area of claim 1, wherein shallow trench isolation regions and the silicon layer are disposed on opposing sides of the deep trench.

7. The radio frequency area of claim 1, wherein opposing portions of the interface layer are separated from each other by at least one of the interlevel dielectric in the deep trench and the implant region in the substrate.

8. A radio frequency area of an integrated circuit, comprising:
    a silicon layer supported by a buried oxide layer and a substrate with an interface layer therebetween, the silicon layer enclosing a shallow trench isolation region, the bottom surface of the silicon layer co-planar with the bottom surface of the shallow trench isolation region; and
    an interlevel dielectric disposed in a deep trench, the interlevel dielectric of the deep trench completely surrounding the silicon layer in a plan view and extending through the silicon layer, the buried oxide layer, and the interface layer over an implant region of the substrate.

9. The radio frequency area of claim 8, wherein a portion of the silicon layer forms a full ring, with inner edges of the portion of the silicon layer abutting the shallow trench isolation region.

10. The radio frequency area of claim 8, wherein all inner edges of a portion of the silicon layer abut edges of the interlevel dielectric in the deep trench.

11. The radio frequency area of claim 8, wherein the silicon layer and the shallow trench isolation region form an island structure separated from corresponding island structures by the interlevel dielectric in the deep trench.

12. The radio frequency area of claim 8, wherein the interlevel dielectric in the deep trench forms a fill ring encircling a polysilicon disposed over the silicon layer.

13. The radio frequency area of claim 12, wherein the polysilicon abuts the silicon layer and sidewalls of the deep trench.

14. A radio frequency area of an integrated circuit, comprising:
    a buried oxide layer disposed over a substrate having an implant region;
    an interface layer between the substrate and the buried oxide layer;
    a silicon layer disposed over the buried oxide layer, the silicon layer having a shallow trench isolation region, the shallow trench isolation region extending to the buried oxide layer;
    a deep trench extending through the silicon layer, the buried oxide layer, and the interface layer, the deep trench vertically aligned with the implant region of the substrate, the deep trench having substantially vertical sidewalls extending from the top surface of the silicon layer to the bottom of the deep trench, the deep trench having a depth greater than the shallow trench isolation region, uppermost sidewalls of the deep trench being the silicon layer; and an interlevel dielectric occupying at least a portion of the deep trench.

15. The radio frequency area of claim 14, wherein a first resistance of the substrate is greater than a second resistance of the interface layer, and wherein the interface layer is inhomogeneous.

16. The radio frequency area of claim 14, wherein a void in the interlevel dielectric occupies at least a portion of the deep trench.

17. The radio frequency area of claim 14, wherein portions of the interface layer on opposing sides of the deep trench are separated by the interlevel dielectric in the deep trench.

18. The radio frequency area of claim 14, wherein portions of the interface layer on opposing sides of the deep trench are separated by the implant region of the substrate.

19. The radio frequency area of claim 14, wherein a silicon dioxide layer is disposed over the silicon layer and the deep trench extends through the silicon dioxide layer.

20. The radio frequency area of claim 19, wherein an etching stop layer is disposed over portions of the silicon dioxide layer, over sidewalls of the deep trench, and over the implant region in the substrate.

\* \* \* \* \*